(12) United States Patent
Yu et al.

(10) Patent No.: US 7,276,759 B1
(45) Date of Patent: Oct. 2, 2007

(54) NON-VOLATILE ELECTRICALLY ALTERABLE SEMICONDUCTOR MEMORY WITH CONTROL AND FLOATING GATES AND SIDE-WALL COUPLING

(75) Inventors: Andy Yu, Palo Alto, CA (US); Ying W. Go, Palo Alto, CA (US)

(73) Assignee: Nanostar Corporation, Palo Alto, CA (US)

( * ) Notice: Subject to any disclaimer, the term of this patent is extended or adjusted under 35 U.S.C. 154(b) by 65 days.

(21) Appl. No.: 10/798,138

(22) Filed: Mar. 11, 2004

(51) Int. Cl.
*H01L 29/788* (2006.01)
(52) U.S. Cl. .............. 257/317; 438/267; 257/E21.179
(58) Field of Classification Search .............. 257/315, 257/317, 321, 324, E21.179, E21.68; 438/257, 438/265, 267
See application file for complete search history.

(56) References Cited

U.S. PATENT DOCUMENTS

| 4,959,812 | A | 9/1990 | Momodomi et al. |
| 4,980,861 | A | 12/1990 | Herdt et al. |
| 5,414,693 | A | 5/1995 | Ma et al. |
| 5,427,968 | A * | 6/1995 | Hong .......................... 438/264 |
| 5,949,711 | A | 9/1999 | Kazerounian |
| 6,191,975 | B1 | 2/2001 | Shimizu et al. |
| 6,462,375 | B1 | 10/2002 | Wu |
| 6,765,260 | B1 * | 7/2004 | Hung et al. ................. 257/315 |
| 6,803,276 | B2 | 10/2004 | Kim et al. |

\* cited by examiner

*Primary Examiner*—David Vu
(74) *Attorney, Agent, or Firm*—Edward C. Kwok; MacPherson Kwok Chen & Heid LLP (57) ABSTRACT

In a memory cell array, each memory cell includes a control gate disposed laterally adjacent a floating gate. The memory cells in each memory column are disposed inside a single well. The control gate and the floating gate are disposed between two diffusion regions. Each memory cell may be erased and programmed by applying a combination of voltages to the diffusion regions, the control gate, and the well.

20 Claims, 11 Drawing Sheets

P-Type Diffusion

| Channel Hot Electron program | | |
|---|---|---|
| | select | unselect |
| Drain | 0v | |
| Source | Vpp | Vpp |
| CG | Vppr | Vpp |
| well | Vpp | Vpp |

| Soft avalanche hot electron (SAHE) program | | |
|---|---|---|
| | select | unselect |
| Source | x | x |
| Drain | Vnn | Vcc |
| CG | Vpp | Vnn2 |
| well | Vcc | Vcc |

N-Type Diffusion

| Channel hot electron (CHE) program | | |
|---|---|---|
| | select | unselect |
| Drain | Vpp | x |
| Source | 0v | 0v |
| CG | 1v to Vcc | 0v |
| well | 0v to Vcc | 0v |

| Channel program | | |
|---|---|---|
| | select | unselect |
| Source | x | x |
| Drain | Vnn | 0v |
| CG | Vpp | Vnn |
| well | Vnn | Vnn |

| Erase for both P-Type and N-Type | | |
|---|---|---|
| | select | unselect |
| Drain | x | x |
| Source | Vpp | x or Vpp |
| CG | Vnn | Vpp |
| well | Vpp | Vpp |

Note:
1. Vnn = -4.5v to -10v
2. Vnn2 = 0v to -4.5v
3. Vpp = 5v to 11v
4. Vpp2 = 4v to 8v
5. Vppr = 0v to Vpp, ramp up or ramp down

FIG. 10

NON-VOLATILE ELECTRICALLY ALTERABLE SEMICONDUCTOR MEMORY WITH CONTROL AND FLOATING GATES AND SIDE-WALL COUPLING

BACKGROUND OF THE INVENTION

1. Field of the Invention

The present invention relates to an electrically erasable and programmable read-only memory (EEPROM) and, more specifically, to Flash EEPROMs employing metal-oxide-semiconductor (MOS) floating gate structures.

2. Description of the Related Art

Electrically erasable and programmable non-volatile semiconductor devices, such Flash EEPROMs are well known in the art. One type of Flash EEPROM employs metal-oxide-semiconductor (MOS) floating gate devices. Typically, electrical charge is transferred into an electrically isolated (floating) gate to represent one binary state while an uncharged gate represents the other binary state. The floating gate is generally placed above and between two regions (source and drain) spaced-apart from each other and separated from those regions by a thin insulating layer, such as a thin oxide layer. An overlying gate disposed above the floating gate provides capacitive coupling to the floating gate, allowing an electric field to be established across the thin insulating layer. Carriers from a channel region under the floating gate are tunneled through the thin insulating layer into the floating gate to charge the floating gate.

Several methods can be employed to erase the charge in a floating gate. One method applies ground potential to two regions and a high positive voltage to the overlying gate. The high positive voltage induces charge carriers, through the Fowler-Nordheim tunneling mechanism, on the floating gate to tunnel through an insulating layer that separates the overlying gate and the floating gate into the overlying gate. Another method applies a positive high voltage to a source region and grounds the overlying gate. The electric field across the layer that separates the source region and the floating gate is sufficient to cause the tunneling of electrons from the floating gate into the source region.

However, shrinking scale of transistors has made it more difficult to program the floating gate devices and reduces the ability of the floating gate devices to hold charge. When the overlaying gate cannot induce enough voltage onto the floating gate, the floating gate cannot retain enough charge for a meaningful read-out. Therefore, the traditional transistor layout is reaching a limitation in miniaturization.

SUMMARY OF THE INVENTION

In one aspect, the invention is an electrically erasable programmable memory device. The memory device includes a first semiconductor layer doped with a first dopant in a first concentration, a second semiconductor layer, adjacent the first semiconductor layer, doped with a second dopant that has an opposite electrical characteristic than the first dopant. The second semiconductor layer has a top side on which two spaced-apart diffusion regions are embedded. Each diffusion region is doped with the first dopant in a second concentration greater than the first concentration, and the two diffusion regions define a first channel region. The two diffusion regions include a first diffusion region and a second diffusion region, a first channel-region defined between the first diffusion region and the second diffusion region. The memory device also includes a floating gate and a control gate. The floating gate is made from a conductive material and disposed adjacent a first diffusion region and above the first channel region and separated therefrom by a first insulator region. The floating gate is capable of storing electrical charge. The control gate is made from a conductive material and disposed laterally adjacent the floating gate and separated therefrom by a first vertical insulator layer. The control gate is adjacent the second diffusion region and above the first channel region and separated therefrom by a second insulator region.

In another aspect, the invention is an electrically erasable programmable memory device. The memory device includes a first semiconductor layer doped with a first dopant in a first concentration, a second semiconductor layer, adjacent the first semiconductor layer, doped with a second dopant that has an opposite electrical characteristic than the first dopant. The second semiconductor layer has a top side in which two spaced-apart diffusion regions are embedded. Each diffusion region is doped with the first dopant in a second concentration greater than the first concentration, and the two diffusion regions define a first channel region. The two diffusion regions include a first diffusion region and a second diffusion region, a first channel region defined between the first diffusion region and the second diffusion region. The memory device also includes a floating gate and a control gate, wherein the control gate surrounds at least two sides of the floating gate. The floating gate is made from a conductive material and disposed adjacent a first diffusion region and above the first channel region and separated therefrom by a first insulator region. The floating gate is capable of storing electrical charge. The control gate is made from a conductive material and disposed laterally adjacent the floating gate and separated therefrom by a first vertical insulator layer. The control gate is adjacent the second diffusion region and above the first channel region and separated therefrom by a second insulator region.

In another aspect, the invention is an electrically erasable and programmable non-volatile memory array with a plurality of memory bytes, where each memory byte includes a plurality of memory cells. Each memory cell has a first connector connected to a drain of a control transistor in the memory cell, a second connector connected to a gate of the control transistor, a third connector connected to a source of the control transistor, wherein the plurality of memory cells are distributed in rows and columns. The control transistor includes a control gate disposed laterally adjacent a floating gate, and the control gate and the floating gate are disposed between two diffusion regions. The memory array also has a plurality of bit lines, each bit line connected to the first connector of every memory cell in a column, a plurality of control lines, each control line being connected to the second connector of every memory cell in a row, and a common source line connected to the third connector of every memory cell in the memory array.

Other advantages and features of the present invention will become apparent after review of the hereinafter set forth Brief Description of the Drawings, Detailed Description of the Invention, and the Claims.

DETAILED DESCRIPTION OF THE INVENTION

Figure 1:
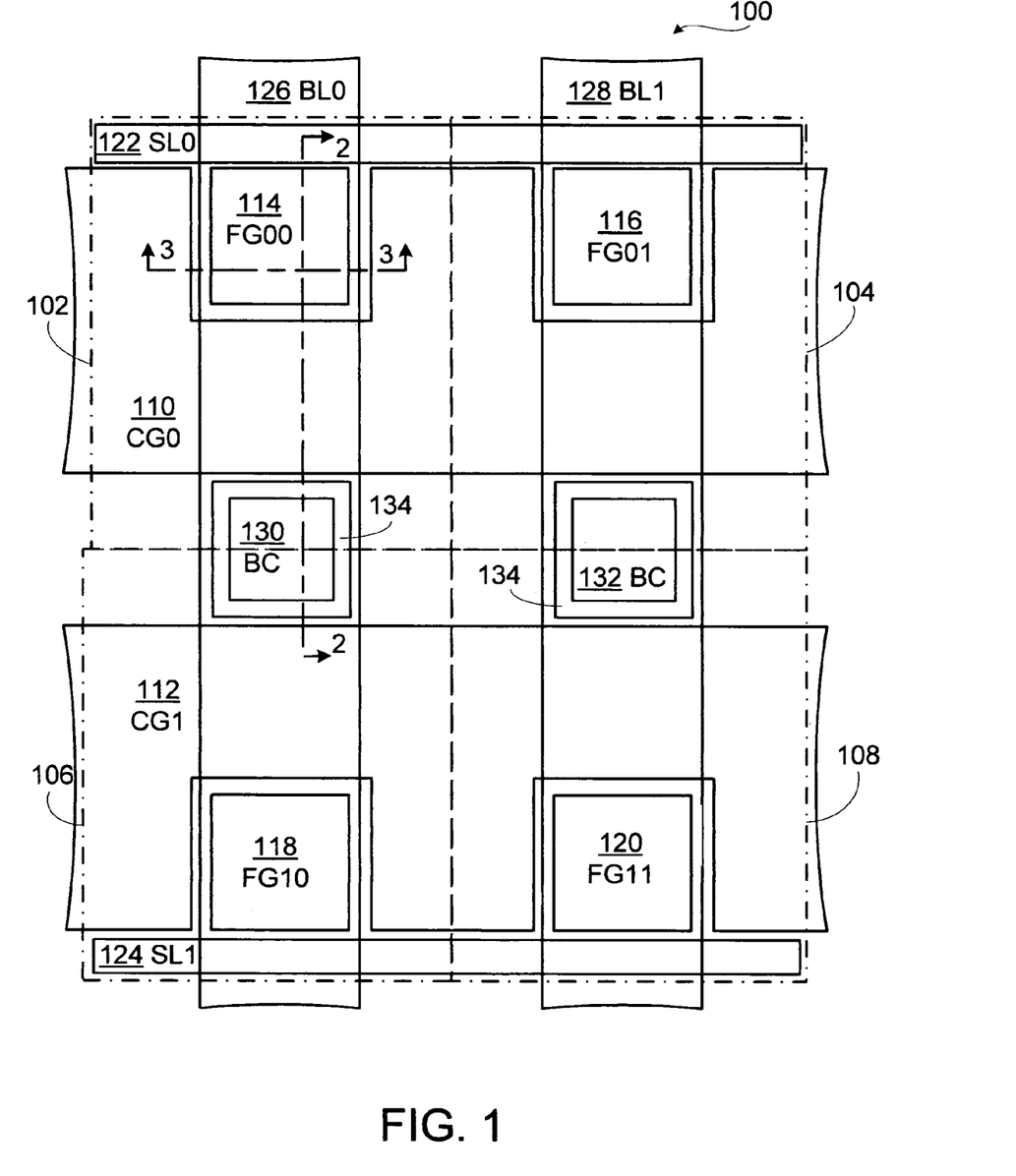
FIG. 1 is a top plan of a plurality of memory cells according to one embodiment of the invention.

Electrically programmable and erasable non-volatile memory device is show in FIG. 1 and includes a top view of an array 100 of four non-volatile electrically erasable and programmable memory cells 102, 104, 106, and 108. The array 100 may be part of a bigger memory array and is formed by two control gate lines 110, 112, two bit lines 126, 128, two select lines 122, 124, four floating gates 114, 116, 118, 120, and two buried contacts 130, 132, which are under two vertical contacts 134. Select lines 122, 124 are in communication with a source line (not shown). A bit line 126 is in contact with a buried contact through the vertical contact 134. A control gate line 110 runs across all memory cells in one row. A bit line 126 runs across all memory cells in one column. A select line runs across all memory cells in one row. Each memory cell is centered around a floating gate.

Figure 2:
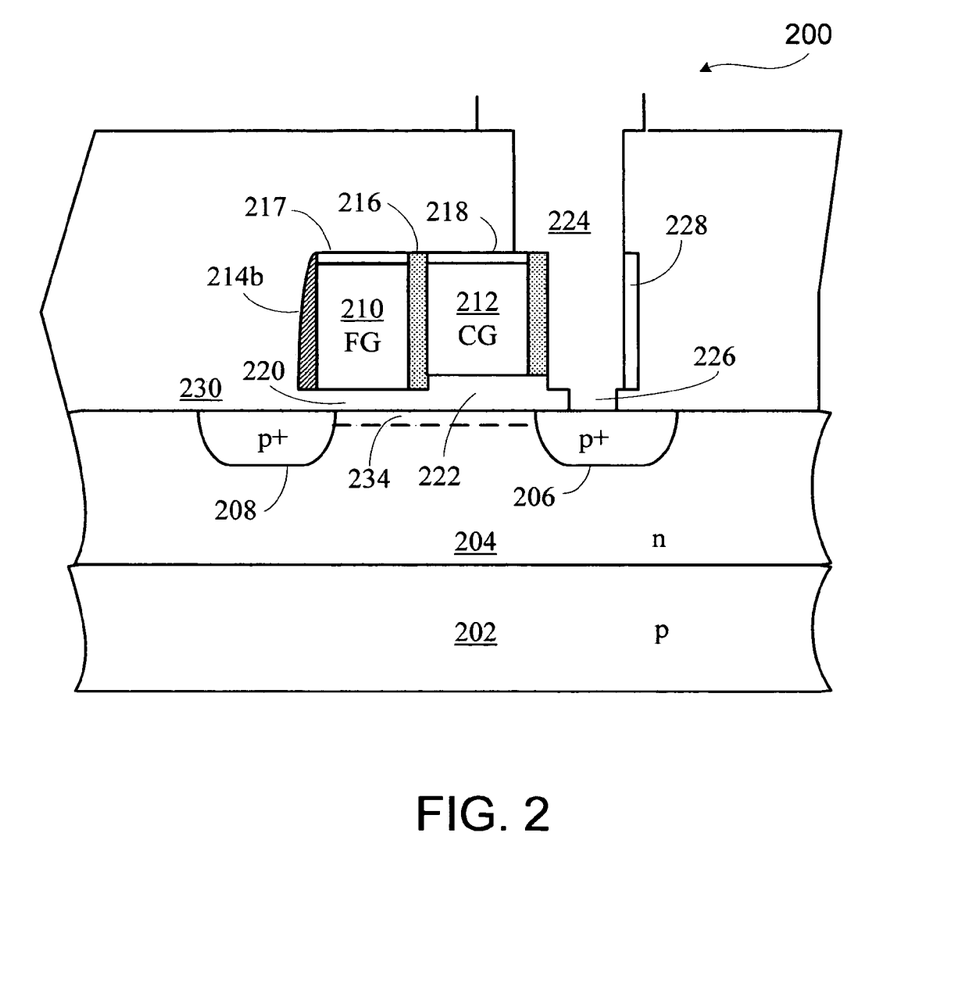
FIG. 2 is a cross sectional view of the memory cell taken along line 2-2.

FIG. 2 is an A-A' cross section view 200 of memory cell 102. The memory cell 102 includes a semiconductor substrate 202 and a well 204 on the top of the substrate 202. The substrate is doped with a first dopant, which can be either N type or P type. The well 204 is a semiconductor doped with a second dopant with an electrical characteristic that is opposite of the first dopant. Two spaced-apart diffusion regions 206, 208 are placed on the top side of the well 204. The diffusion regions are doped with the same dopant used for doping the substrate 202 but doped with a concentration that is higher than that of the substrate 202. A channel region 234 is defined between two diffusion regions 206, 208. An insulating layer 230 is placed on the top of the well 204 and the diffusion regions 206, 208. The insulating layer 230 may be formed by an insulating oxide material or other suitable insulating materials. Though FIG. 2 illustrates the diffusion regions implemented in a single well, it is understood that other implementations, such as twin wells, triple wells, or oxide isolation wells may also be used. The separation of active devices may be accomplished through localized oxidation (LOCOS), recessed LOCOS, shallow trench isolation (STI), or full oxide isolation.

A floating gate 210 of polysilicon material is placed above the channel region 234 and adjacent diffusion region 208. The floating gate 210 may overlap slightly with the diffusion region 208, however, excessive overlapping may reduce the length of the channel region 234. The floating gate 210 is separated from the channel region 234 by a tunnel channel 220 (also known as tunnel oxide) of the insulating layer 230. The thickness of the tunnel channel 220 should be thin enough to allow removal of electrons from the floating gate 210 under the Fowler-Nordheim tunneling mechanism, but thick enough to prevent the occurrence of a leakage current between the floating gate 210 and the well 204.

A control gate 212 is placed above the channel region 234, adjacent laterally to the floating gate 210 and separated from the floating gate by a vertical insulating layer 216, which can be oxide-nitride-oxide or other suitable material. The control gate 212 is separated from the channel region 234 by a separation channel 222 (also known as separation oxide) of the insulating layer 230. The thickness of the separation channel 222 should be thick enough to sustain the stress from the control gate's 212 voltage variation. The voltage at the control gate 212 may vary during operation of the memory cell 102 and cause stress on the insulating layer 230, thus leading to the deterioration of the separation channel 222. The control gate 212 may be formed by a polysilicon grown at a different stage as the floating gate 210. The control gate 212 may be connected to control gates in other memory cells in the same row in a memory array. The control gate 212 surrounds the floating gate 210 on three sides as shown in FIG. 1. However, in an alternative embodiment (not show) the control gate 212 may be adjacent the floating gate 210 from only one lateral side. In yet another embodiment (not shown), the control gate 212 may surround the floating gate 210 on two lateral sides.

The diffusion region 206 is connected to a bit line 126 through a conductive vertical contact 224. The conductive vertical contact 224 may be a conductive material, such as tungsten. The placement of the conductive vertical contact 224 is through a self-alignment process. An alignment polysilicon 228 is placed above the diffusion region 206 and adjacent the control gate 212. The alignment polysilicon 228 is separated from the control gate 212 by the vertical insulating layer 216. A connecting shaft is etched through the insulating layer 230, the alignment polysilicon 228, and the separation channel 222 creating a buried contact 226. The conductive material, such as tungsten, is filled into the connecting shaft and makes contact with the diffusion region 206. The etching process is conducted in such way that the vertical insulating layer 216 and a top control layer 218 are minimally affected, thereby preventing the contact between the control gate 212 and the vertical contact 224.

The floating gate 210 may be covered on the top by a top floating layer 217 of silicon nitrate, and the top of the control gate 212 may be covered by a top control layer 218 of insulating material such as oxide-nitride-oxide. The top floating layer 217 and the control layer 218 may be polished by a chemical-mechanical process (CMP). The CMP removes the polysilicon from the control gate 212 that may be deposited on the top of polysilicon of the floating gate 210 and makes easier the etching process for the polysilicon of the floating gate 210. The floating gate 210 and the alignment polysilicon 228 may be wrapped by a spacer 214b. The memory cell 200 may be separated from the next memory cells by insulating regions (not shown) of insulating material such as oxide.

When a voltage is applied to the control gate 212, through a coupling effect, a voltage is induced on the floating gate 210. The coupling effect depends on the thickness of the layer separating the control gate 212 from the floating gate 210 and the area on the floating gate 210 exposed to the coupling effect. The coupling effect can be easily increased by increasing the area of the floating gate 210 exposed to the control gate 212, and the area of the floating gate 210 exposed to the control gate 212 may be increased by increasing the heights of the control gate 212 and the floating gate 210. A capacitor is formed between the control gate 212 and the floating gate 210. When a floating gate 210 is surrounded by a control gate 212 in more than one lateral side, the coupling effect is increased and the capacitance between the floating gate 210 and the control gate is increased. If the layer separating the control gate 212 and the floating gate 210 is too thin, a leakage current may occur between the floating gate 210 and the control gate 212 when the floating gate 210 is charged with electrons. If the layer is too thick, the coupling ratio may be low, resulting in a low voltage in the floating gate. One workable coupling ratio is between 50%-80%, i.e., 10 V applied to the control gate 212 results in 5 V to 8 V induced in the floating gate 210. The combination of the control gate 212, the floating gate 210, and the diffusion region 206, 208 forms a control transistor, where the diffusion regions 206, 208 serve as drain and source for the control transistor.

The induction of voltage on the floating gate 210 is important when erasing or programming the memory cell 200. When programming the memory cell 200, a positive high voltage (Vpp) between 5V and 11V is applied to the diffusion region 208, and the diffusion region 206 is left at 0 V. A positive high voltage (Vpp) between 5V and 11V is also applied to the well 204. A ramping positive high voltage (Vppr) applied to the control gate 212, i.e., the positive high voltage between 5V and 11V is initially applied to the control gate 212, and this positive high voltage is gradually ramped down to 0V and then ramped up back to 5V-11V. When the control gate 212 is at the positive high voltage of 5V-11V, a voltage is induced onto the floating gate 210 and the channel 234 between the diffusion regions 206 and 208 is turned off. Although the floating gate 210 is at a positive voltage level, no electrons are injected into the floating gate 210 because the channel 234 is off and there is no flow of electrons between the diffusion regions 206 and 208. As the voltage at the control gate 212 ramps down, the potential difference between the control gate 212 and the well 204 turns on the channel between the diffusion regions 206 and 208, and electrons start to flow in the channel 234. The voltage at the floating gate 210 also drops as the voltage at the control gate 212 ramps down, but the voltage at the floating gate 210 is still sufficient to cause some high energy electrons (also known as hot electrons) to be injected into the floating gate 210. When the control gate 212 reaches zero voltage, the channel 234 is turned on, but no electrons are injected into the floating gate 210 because the floating gate 210 is also at zero voltage. When the voltage at the control gate 212 starts to ramp up back to 5V-11V, the voltage at the floating gate 210 also ramps up, and high energy electrons from the channel 234 start to be injected into the floating gate 210 again. When the control gate 212 is at positive high voltage of 5V-11V, the channel 234 is turned off, electrons stop flowing, and no more electrons are injected into the floating gate 210. The number of electrons injected into the floating gate 210 depends on the duration of the ramp down/up process and the concentration of dopants in the channel region. This voltage ramping process may be repeated for the floating gate 210 to retain enough charge to represent a logic state properly. Once charges of electrons are inside of the floating gate 210, the floating gate 210 may hold the charges for years.

The amount of charge injected into the floating gate 210 determines the threshold voltage for the control transistor formed by the control gate 212, the floating gate 210, and the diffusion regions 206, 208. The floating gate 210 may hold different amount of charges, thus having different threshold voltages. In one embodiment of the invention, through repeating the voltage ramping process, the floating gate 210 may have four different levels of threshold voltages and capable of representing four logic states. The four logic states may be read and distinguished by measuring the current flowing between the diffusion regions 206, 208.

A negative voltage is applied to the control gate 212, a positive high voltage (Vpp) is applied to the well 204 and the diffusion region 208 when it is desired to erase charges in the memory cell 200. The negative voltage at the control gate 212 is induced to the floating gate 210. The combination of an induced negative voltage at the floating gate 210 and positive high voltages at the well 204 and the diffusion region 208 forces charges out of the floating gate 210 and into the well 204, thus removing the charge from the floating gate 210.

When it is desired to read the content of a memory cell, a voltage between −2 and Vcc is applied to the control gate 212, and Vcc is applied to the diffusion region 208 and the well 204. The charge inside the floating gate 210 and the voltage at the control gate 212 turn on the channel 234 and current flows from the diffusion region 208 to the diffusion region 206. The voltage at the diffusion region 206 resulting from the channel 234 being open and the current flow is detected by the bit line 126 through the conductive vertical contact 224. If the floating gate 210 is without charge, then the channel 234 will not be turned on and there will be no current flowing between diffusion region 208 and diffusion region 206. A sense-amplifier connected to the conductive connector 234 will be able to detect the current, thereby recognizing that the floating gate 210 is charged with electrons. If the floating gate 210 is not charged, then no channel is established between the diffusion regions 206 and 208 and the sense-amplifier will not be able to detect any current. The absence of a current between the diffusion regions 206 and 208 indicates the floating gate 210 is without electrons or with only few electrons left inside the floating gate 210. A floating gate 210 with electrons is assigned to a first logic state while a floating gate 210 without electrons is assigned to an opposite second logic state. When the floating gate 210 is programmed to store different levels of charge and thus with different levels of threshold voltage, the intensity of the current flowing between diffusion region 208 and diffusion region 206 depends on the threshold voltage of the floating gate 210. The intensity of this current can be sensed by the sense-amplifier, thus the logic level of the floating gate determined. Programming voltages for other embodiments and operations are listed in FIG. 11.

Figure 3:
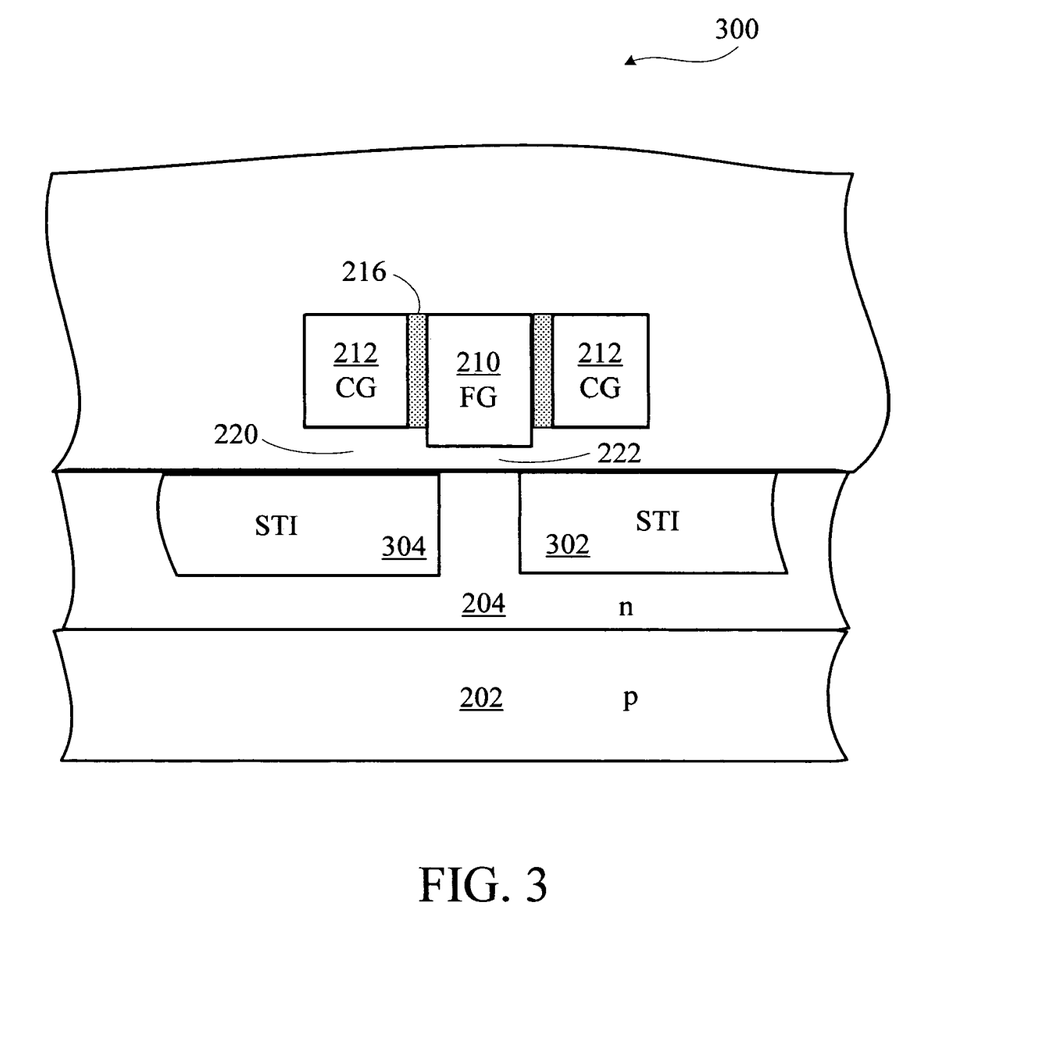
FIG. 3 is a cross sectional view of the memory cell taken along line 3-3.

The control gates 212 in memory cell 102 may extend horizontally to next memory cell 104. However, the control gates 212 are shown truncated in FIG. 3 for the purpose of illustrating an individual memory cell. The memory cell 102 is separated from its neighboring memory cells by shallow trench isolation (STI) 302, 304 implemented on the well 204. The STI 302 may run along the direction of a memory column and thus separate memory cells of one column from the memory cells of a neighboring column. Other methods of isolation, such as oxide isolation, may also be used.

Figure 4:
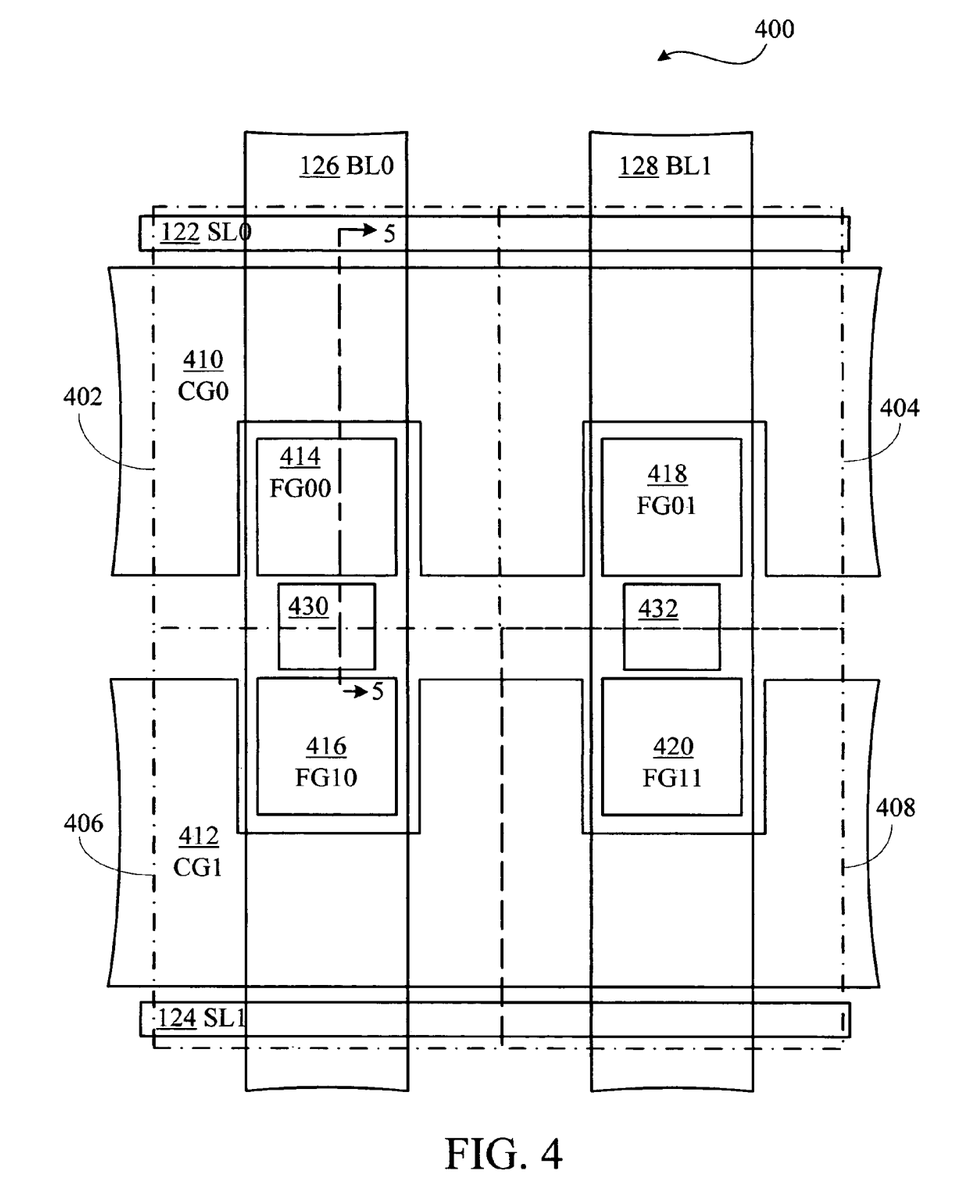
FIG. 4 is a top plan of a plurality of memory cells according to an alternative embodiment of the invention.

As shown in FIG. 4, in one embodiment of a memory array 400 including four memory cells 402, 404, 406, and 408 is shown. The array 400 may be part of a bigger memory array and is formed by two control gate lines 410, 412, two bit lines 126, 128, two-select lines 122, 124, four floating gates 414, 416, 418, 420, and two buried contacts 430, 432. Each bit 126 line runs across all memory cells in one column and is in contact with a buried contact 430 in the column through a vertical contact (not shown). Each control gate line 410 runs across all memory cells in one row. Each select line 122 runs across all memory cells in one row. Each memory cell 402 is centered around a floating gate.

Figure 5:
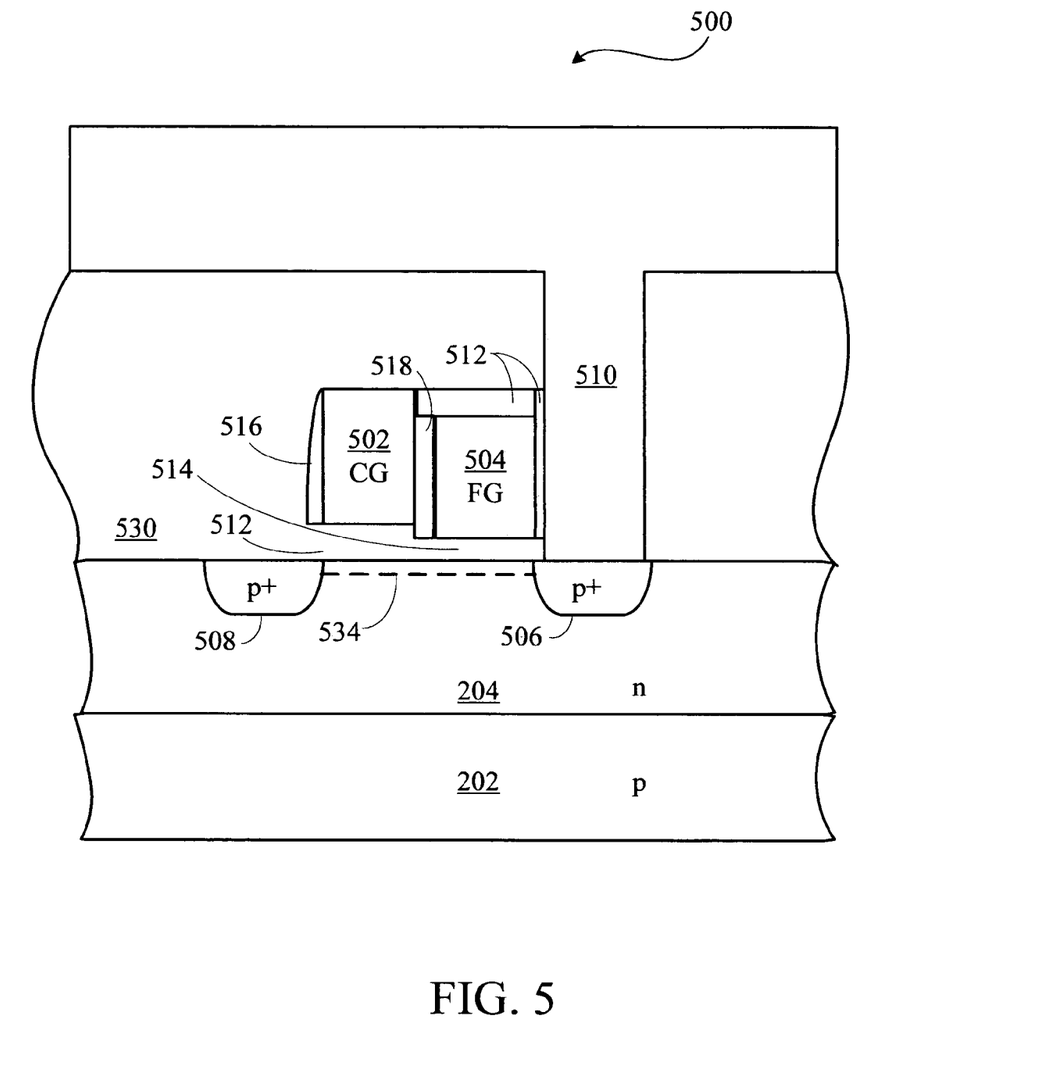
FIG. 5 is a cross sectional view of the memory cell shown in FIG. 4 taken along line 5-5.

A cross section view 500 of memory cell 402 is shown in FIG. 5. The memory cell 402 includes a semiconductor substrate 202 and a well 204 on the top of the substrate 202. Two spaced-apart diffusion regions 506, 508 are placed on the top side of the well 204. The substrate 202, the well 204, and the diffusion regions 506, 508 are doped in a similar manner as described above for FIG. 2. A channel region 534 is defined between two diffusion regions 506, 508. An insulating layer 530 is placed on the top of the well 204 and the diffusion regions 506, 508. The insulating layer 530 may be formed by an insulating oxide material or other suitable insulating materials. Though FIG. 5 illustrates the diffusion regions implemented in a single well, it is understood that other implementations, such as twin wells, triple wells, or oxide isolation wells may also be used. The separation of active devices may be accomplished through localized oxidation (LOCOS), recessed LOCOS, shallow trench isolation (STI), or full oxide isolation.

A floating gate 504 of polysilicon material is placed above the channel region 534 and the adjacent diffusion region 506. The floating gate 504 may overlap slightly with the diffusion region 506, however, excessive overlapping may reduce the length of the channel region 534. The floating gate 504 is separated from the channel region 534 by a tunnel channel 514 of the insulating layer 530 and the thickness of the tunnel channel 514 should be thin enough to allow removal of electrons from the floating gate 504 under the Fowler-Nordheim tunneling mechanism and still thick enough to prevent the occurrence of a leakage current between the floating gate 504 and the well 204.

A control gate 502 is placed above the channel region 534, adjacent laterally to the floating gate 504 and separated from the floating gate by a vertical insulating layer 518, which can be oxide-nitride-oxide or other suitable material. The control gate 502 is separated from the channel region by a separation channel 512 of the insulating layer 530. The control gate 502 may be formed by polysilicon grown at a different stage as the floating gate 504. The control gate 502 is connected to control gates in other memory cells in the same row in a memory array. The control gate 502 surrounds the floating gate 504 in three sides, as shown in FIG. 4. However, in an alternative embodiment (not show) the control gate 502 may be adjacent the floating gate 504 from only one lateral side. In yet another embodiment (not shown), the control gate 504 may surround the floating gate 504 on at least two lateral sides.

The diffusion region 506 is connected to a bit line 126 through a conductive vertical contact 510. The conductive vertical contact 510 may be a conductive material, for example, tungsten. The placement of the conductive vertical contact 510 is through a classic self-alignment process. A connecting shaft is etched through the insulating layer 530 to reach the diffusion region 506. The conductive material is filled into the connecting shaft through deposition and making contact with the diffusion region 506. An insulating layer 512 is placed around the floating gate 504 to ensure the isolation between the floating gate 504 and the vertical contact 510. Although other contact processes may be used to implement the conductive vertical contact 510, the self-alignment process yields to small cell size.

The memory cell 402 shown in FIG. 4 may be programmed when a positive high voltage (Vpp) between 5V and 11V is applied to the control gate 502, a negative voltage between −4.5V and −10V is applied to the diffusion region 506 that serves as drain for the memory cell 402, and the well 204 is left at Vcc. The positive high voltage of the control gate 502 induces a positive voltage to the floating gate 504. The differential voltage between the positive voltage at the well 204 and the negative voltage at the diffusion region 506 causes a soft avalanche breakdown at the P-N junction and freeing high energy electrons. The freed hot electrons are injected into the floating gate 504. To erase and to read the content of a memory cell 402, the voltages described above for the embodiment shown in FIG. 2 may be used.

Figure 6:
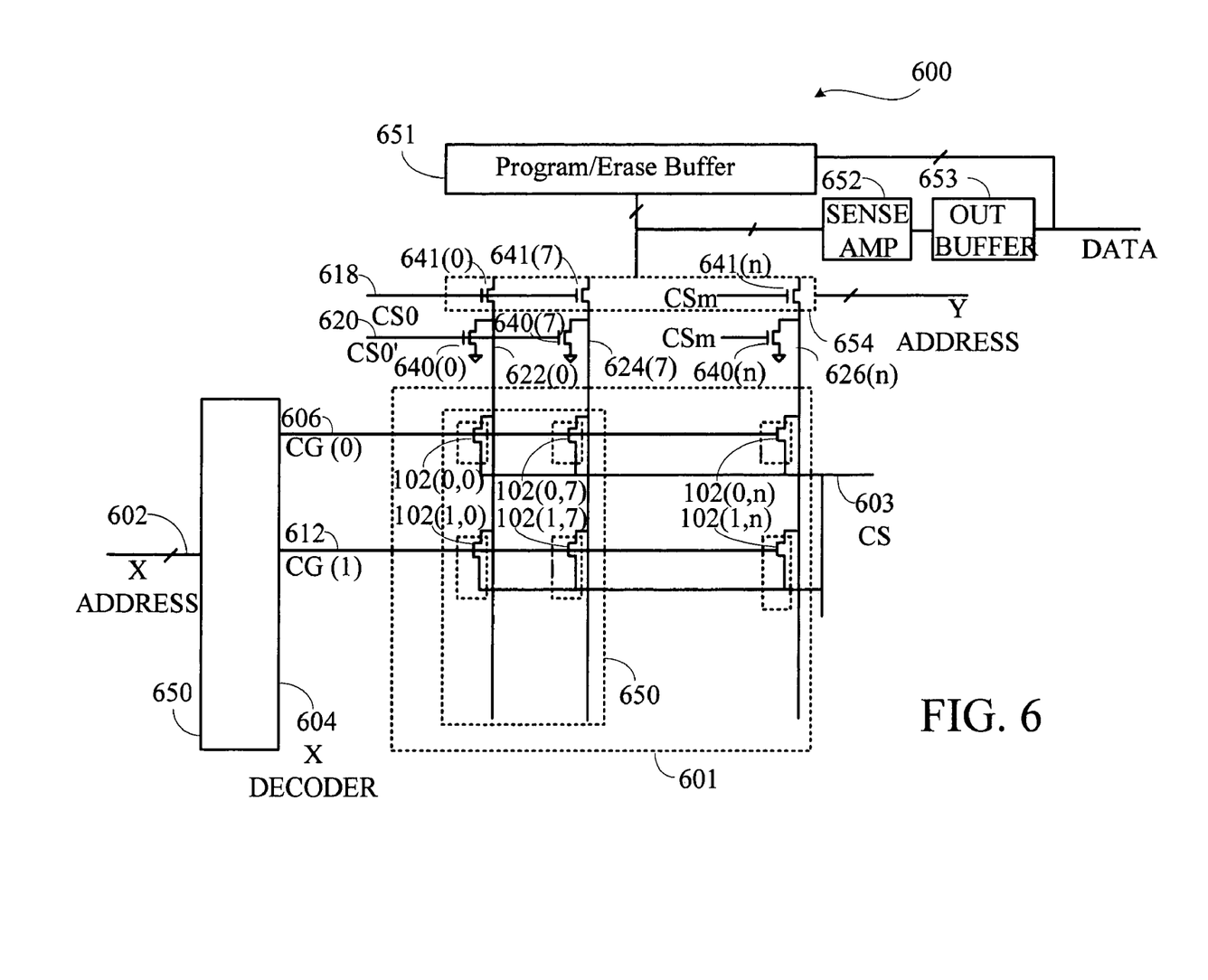
FIG. 6 is a schematic diagram of a memory array according to one embodiment the invention.

Though the memory cell 102 may be programmed, erased, and read individually, when multiple memory cells 102 are arranged in a memory array, byte operations can be easily obtained. FIG. 6 illustrates an architecture 600 according to the invention. A memory array 601 has a plurality of memory cells 102 (or 402) organized in rows and columns. Memory cell 102(0, 0) represents a memory cell in row 0 and column 0 and memory cell 102(0, 7) represents a memory cell in row 0 and column 7, so on and so forth. Not all memory cells are represented in FIG. 6. All the memory cells in the same byte in the memory array 601 are placed in a same well 650. Wells 650 are isolated from each other by an insulating layer such as the STI. Alternatively, the wells 650 of different sectors may be connected together, where a sector may include memory cells in different memory rows.

Each memory cell 102 is formed by control transistor as described above. All the control transistors in one row are connected to a control signal 606. Each row may have many memory cells that form one or more words. The activation of the control signal 606 depends on the output of an X address decoder 604.

Each memory cell 102 has two additional connectors: a first connector connects the conductive connector 224 to a bit line 622 and a second connector connects the diffusion region 208 to a source 603. The source 603 for memory cells in one sector may be connected together. A bit line 622(0) represents the bit line for column 0, and a bit line 622(7) represents a bit line for column 7. Each bit line is controlled by a pass transistor 641 and a discharging transistor 640.

During a programming mode, the pass transistor 641 is turned on and discharging transistor 640 is turned off for the selected bit line 622 and the bit line 622 is connected to a bit in the program/erase buffer 651. In the erase mode, the discharging transistors 640 of the selected bit lines 622 are turned off and the discharging transistors 640 of the unselected bit lines 622 are turned on. In the read mode, the pass transistors 641 of the selected bit lines 622 are turned on and discharging transistors 640 are turned off, and the bit lines 622 are isolated from the program/erase buffer 651. The bit line 622 is sensed by a sense-amplifier 652. The pass transistors 641 of bit lines for a memory byte are connected to one charging control line CS 618 and the discharging transistors 640 for the same bit lines are connected to a discharging control line CS' 620.

Figure 7:
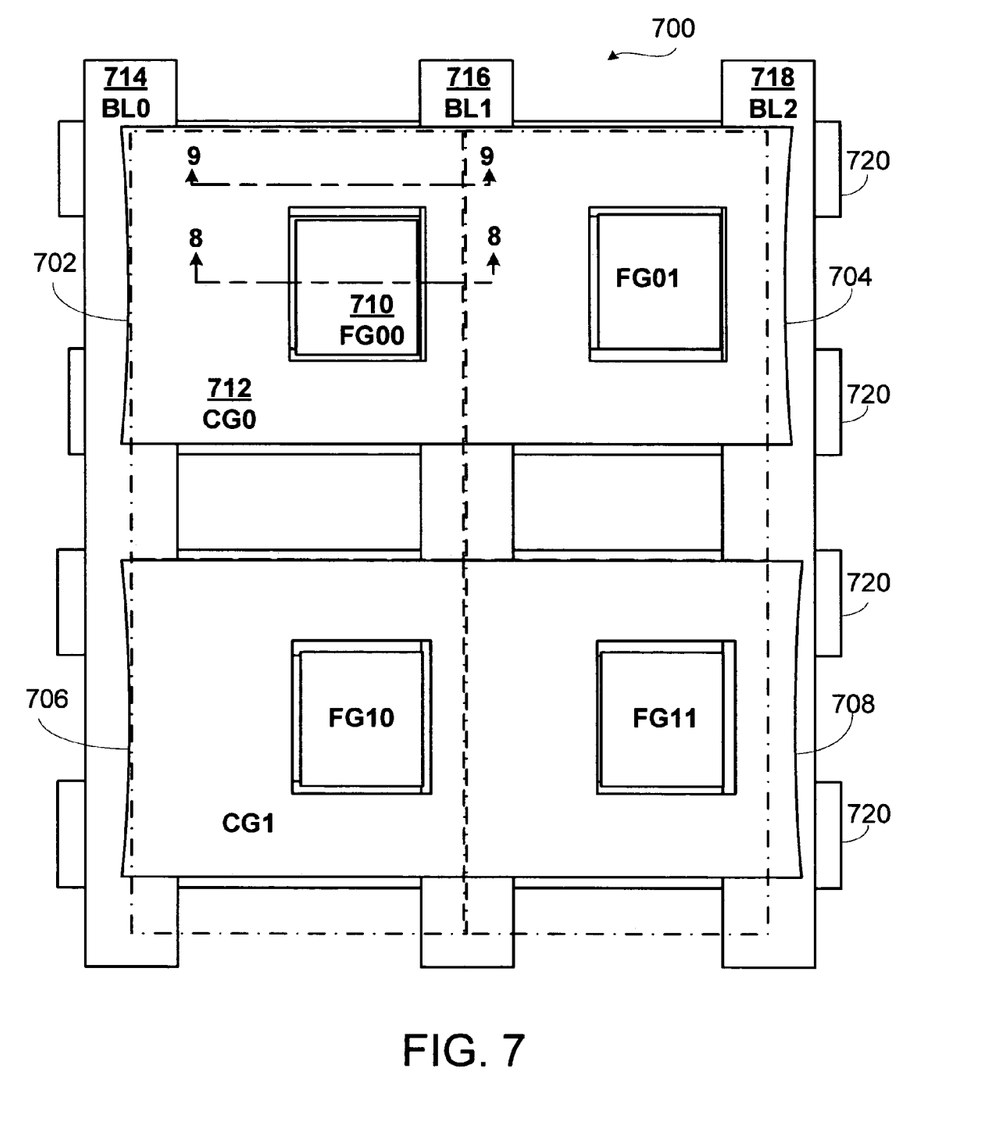
FIG. 7 is a top plan of a plurality of memory cells according to one embodiment of the invention.
Figure 8A:
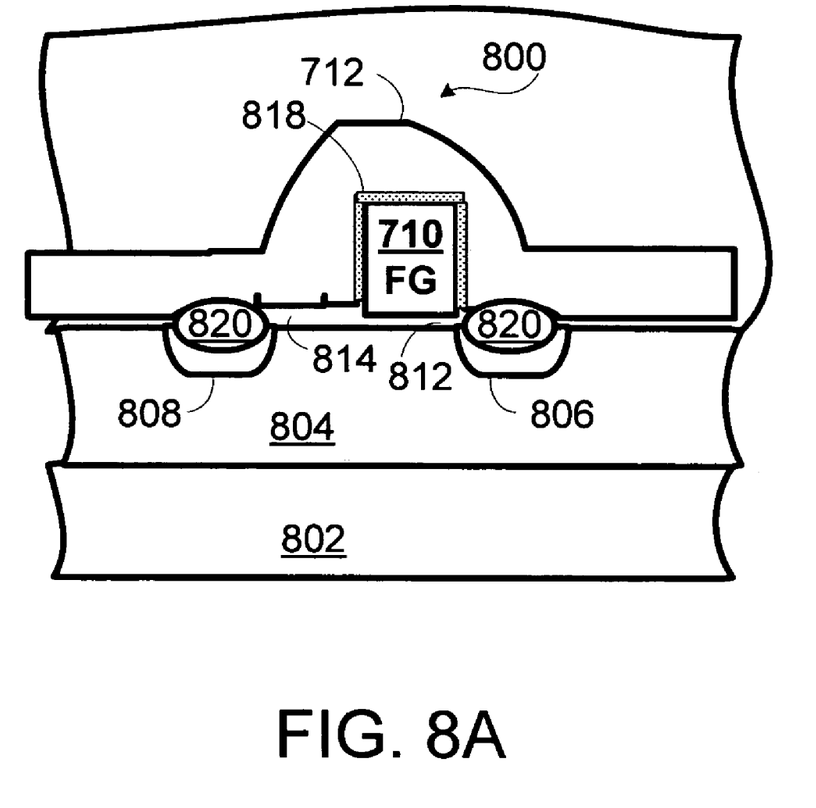
FIG. 8A is a cross sectional view of the memory cell shown in FIG. 7 taken along line 8-8.

FIG. 7 is a top view of another embodiment of a memory array 700 of the invention. The memory array 700 includes four memory cells 702, 704, 706, 708. Each memory cell 702 includes a floating gate 710 surrounded by a control gate 712. FIG. 8A is a cross sectional view of the memory cell 702 taken along line 8-8. The memory cell 702 includes a semiconductor substrate 802 and a well 804 on the top of the substrate 802. The substrate is doped with a first dopant, which can be either N type or P type. The well 804 is a semiconductor doped with a second dopant with an electrical characteristic that is opposite of the first dopant. Two spaced-apart diffusion regions 806, 808 are placed on the top side of the well 804. The diffusion regions are doped with the same dopant used for doping the substrate 802 but doped with a concentration that is higher than that of the substrate 802. The diffusion regions 806, 808 are the bit lines 714, 716 shown in FIG. 7. An isolation layer 820 runs on the top of each diffusion region 806, 808. The isolation layer 820 may be an oxide isolation. A floating gate 710 is placed between the diffusion regions 806, 808 and surrounded in four sides and the top side with the control gate 712. The floating gate 710 is separated from the control gate 712 by an isolating layer 818. The operations of the memory cell 702 are the same as described above for FIG. 2.

Figure 8B:
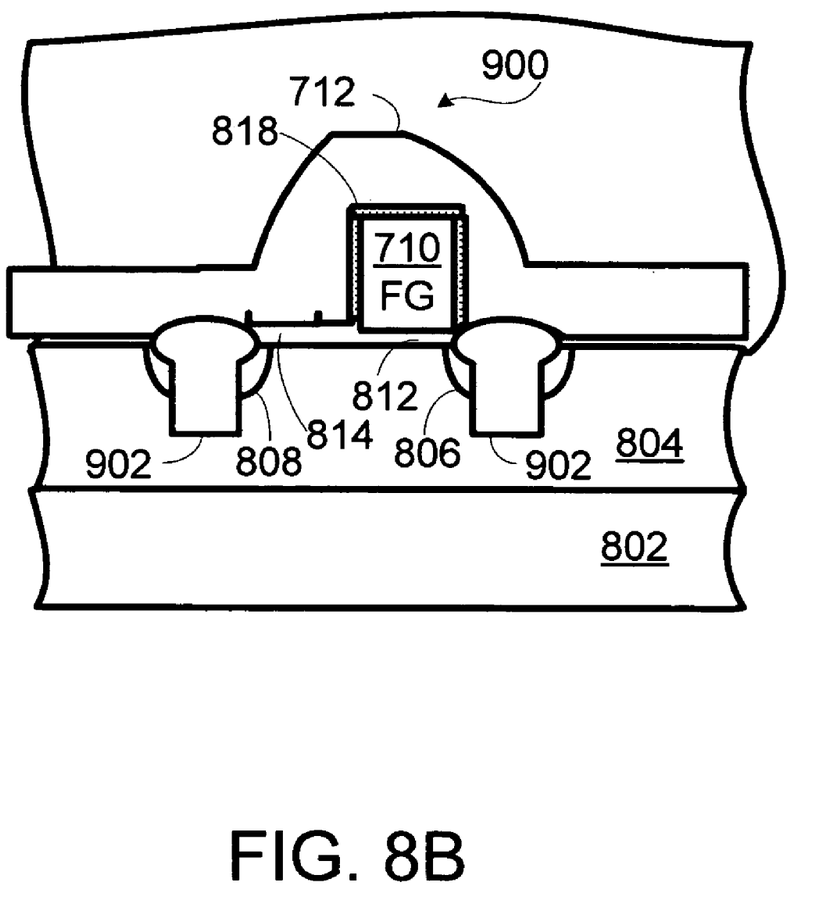
FIG. 8B is a cross sectional view of an alternative embodiment of the memory cell shown in FIG. 7 taken along line 8-8.
Figure 9:
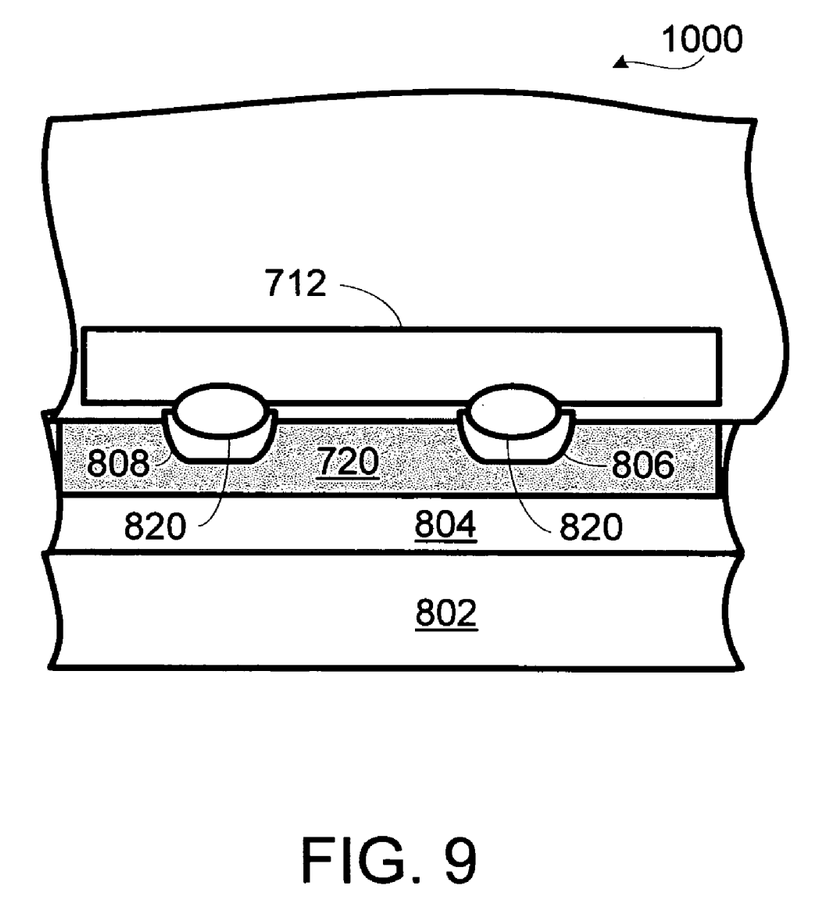
FIG. 9 is a cross sectional view of the memory cell shown in FIG. 7 taken along line 9-9.
Figure 10:
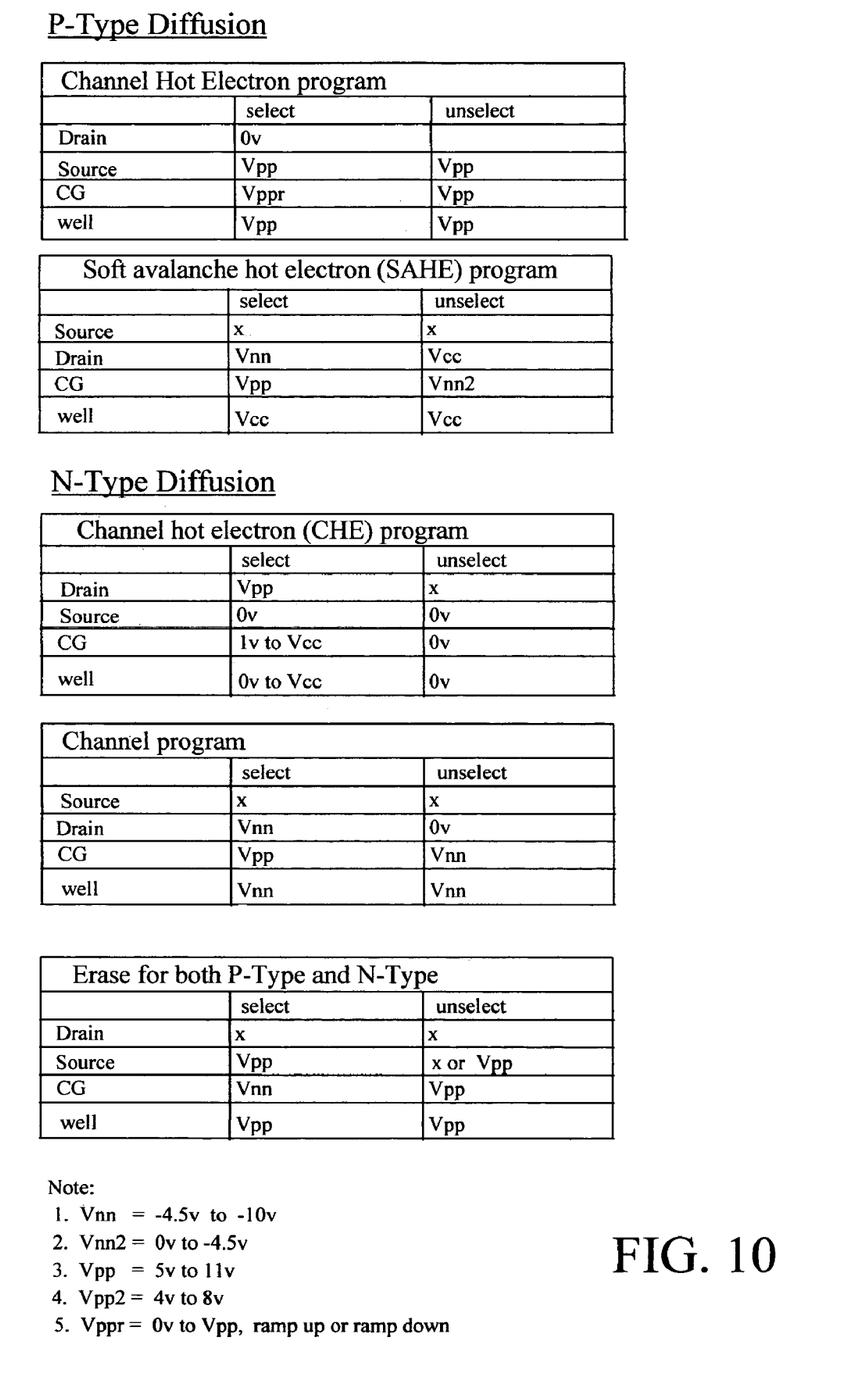
FIG. 10 illustrates several voltage tables for use with the invention.

FIG. 8B is a cross sectional view of an alternative embodiment of the memory cell 702 shown in FIG. 7 taken along line 8-8, where shallow trench isolations (STI) 902 are used to isolate memory cells in the same memory row. The STI 902 isolates a bit line from an adjacent bit line and reduces bit line loading coming from the adjacent bit lines. FIG. 9 is a cross sectional view of the memory cell 702 shown in FIG. 7 taken along line 9-9. It is shown a channel stop implant 720. The channel stop implants 720 define the channel for a transistor in each memory cell.

The thickness of each gate (control gate, and floating gate) depends on the manufacturing process; currently most common thickness is about 3000 Angstroms or 0.3 micron. The thickness of the tunnel channel 220, 514 depends also on manufacturing process. However, a preferred thickness for the tunnel channel 220, 514 is between 70 Angstroms and 110 Angstroms. Similarly, the thickness of the insulating layer separating the control gate from the well is around 150 Angstroms. The thickness of the control gate should be able to sustain the stress induced by control gate voltage. The materials and measurements mentioned heretofore are for illustration purposes and not intended to limit the scope of the present invention. It is recognized that as technology evolves, other suitable materials and manufacturing processes may be employed to realize the present invention. It is also understood that the structures disclosed heretofore can be easily implemented by any of existing semiconductor manufacturing processes known to those skilled in the art.

Although, the present application is described for Flash EEPROMs, it is understood that the invention is equally applicable for one-time-programmable (OTP) memories, multiple-time-programmable (MTP) memories, and other non-volatile memories.

While the invention has been particularly shown and described with reference to a preferred embodiment thereof, it will be understood by those skilled in the art that various changes in form and detail may be made without departing from the spirit and scope of the present invention as set forth in the following claims. Furthermore, although elements of the invention may be described or claimed in the singular, the plural is contemplated unless limitation to the singular is explicitly stated.

What is claimed is:

1. An electrically erasable programmable memory device, comprising:
   a first semiconductor layer doped with a first dopant in at a first concentration;
   a second semiconductor layer, adjacent the first semiconductor layer, doped with a second dopant that has an opposite electrical characteristic than the first dopant, the second semiconductor layer having a top side;
   a first diffusion region and a second diffusion region embedded in the top side of the second semiconductor layer and defining a channel region therebetween, each diffusion region being doped with the first dopant in at a second concentration greater than the first concentration;
   a floating gate, comprising a conductive material, disposed adjacent the first diffusion region and above the first channel region and separated therefrom by a first insulator region, the floating gate being capable of storing electrical charge; and
   a control gate, comprising a conductive material, disposed laterally adjacent the floating gate and separated therefrom by a first vertical insulator layer, wherein the control gate is adjacent the second diffusion region and above the first channel region and separated therefrom by a second insulator region, and wherein the control gate and the floating gate share a planarized top surface.

2. The memory device of claim 1, wherein the first dopant has a P-type characteristic and the second dopant has an N-type characteristic.

3. The memory device of claim 1, wherein the first dopant has an N-type characteristic and the second dopant has a P-type characteristic.

4. The memory device of claim 1, wherein the first insulator region has a thickness that allows tunneling of charge between the floating gate and the first channel region.

5. The memory device of claim 4, wherein the thickness is between 70 angstroms and 110 angstroms.

6. The memory device of claim 1, wherein the vertical insulator is made from a silicon dioxide having a thickness that prevents leakage between the floating gate and the control gate.

7. The memory device of claim 1, wherein the first vertical insulator is made from an oxide-nitrite-oxide material having a thickness that prevents leakage between the floating gate and the control gate.

8. The memory device of claim 1, wherein the floating gate and the control gate are wrapped by a spacer.

9. The memory device of claim 1, wherein the second diffusion is in contact with a vertical connector, the vertical connector being separated from the control gate by a second vertical insulator.

10. The memory device of claim 9, wherein charge is transported from the first channel region to the floating gate when a first combination of voltages are applied to the first diffusion region, the second diffusion region, the control gate, and the second semiconductor layer.

11. The memory device of claim 10, wherein the first combination of voltages are applied according to a method which comprises:
    applying a positive high voltage to the second semiconductor layer;
    applying a positive high voltage to the first diffusion region;
    applying zero voltage to the second diffusion region; and
    applying to the control gate a decreasing positive voltage over a first time period, followed by an increasing voltage over a second time period.

12. The memory device of claim 10, wherein the first combination of voltages are applied according to a method which comprises:
    applying a positive voltage between 1V and a programming voltage to the control gate;
    applying a zero voltage to the first diffusion region;
    applying a positive high voltage to the second diffusion region; and
    applying a positive voltage between 0V to a supply voltage to the second semiconductor layer.

13. The memory device of claim 9, wherein charge inside the floating gate can be determined when a first combination of voltages are applied to the first diffusion region, the control gate, and the second semiconductor layer.

14. The memory device of claim 13, wherein the first combination of voltages are applied according to a method which comprises:
   applying a supply voltage to the second semiconductor layer;
   applying a supply voltage to the first diffusion region; and
   applying a voltage between −2V and the supply voltage to the control gate.

15. The memory device of claim 1, wherein the first diffusion is in contact with a vertical connector, the vertical connector being separated from the floating gate by a second vertical insulator.

16. The memory device of claim 15, wherein charge is transported from the first channel region to the floating gate when a second combination of voltages are applied to the first diffusion region, the control gate, and the second semiconductor layer.

17. The memory device of claim 16, wherein the second combination of voltages are applied according to a method which comprises:
   applying a positive high voltage to the control gate;
   applying a negative voltage to the first diffusion region; and
   applying a supply voltage to the second semiconductor layer.

18. The memory device of claim 16, wherein the second combination of voltages are applied according to a method which comprises:
   applying a positive high voltage to the control gate;
   applying a negative voltage to the first diffusion region; and
   applying a negative voltage to the second semiconductor layer.

19. The memory device of claim 1, wherein charge is transported from the floating gate to the first channel area when a third combination of voltages are applied to the second semiconductor layer, the control gate, and the first diffusion region.

20. The memory device of claim 19, wherein the third combination of voltages are applied according to a method which comprises:
   applying a negative voltage to the control gate;
   applying a high positive voltage to the second semiconductor layer; and
   applying a positive high voltage to the first diffusion region.

* * * * *